(12) United States Patent
Zeng et al.

(10) Patent No.: US 11,688,732 B2
(45) Date of Patent: Jun. 27, 2023

(54) SHORT CIRCUIT PROTECTION STRUCTURE IN MOS-GATED POWER DEVICES

(71) Applicant: Infineon Technologies Austria AG, Villach (AT)

(72) Inventors: Guang Zeng, Haar (DE); Anton Mauder, Kolbermoor (DE); Joachim Weyers, Hoehenkirchen (DE)

(73) Assignee: Infineon Technologies Austria AG, Villach (AT)

( * ) Notice: Subject to any disclaimer, the term of this patent is extended or adjusted under 35 U.S.C. 154(b) by 205 days.

(21) Appl. No.: 17/120,932

(22) Filed: Dec. 14, 2020

(65) Prior Publication Data

US 2021/0193646 A1 Jun. 24, 2021

(30) Foreign Application Priority Data

Dec. 23, 2019 (DE) .......................... 102019135762.4

(51) Int. Cl.
*H01L 27/02* (2006.01)
(52) U.S. Cl.
CPC ................................ *H01L 27/0255* (2013.01)
(58) Field of Classification Search
CPC ............. H01L 27/0255; H01L 27/0251; H01L 29/8611
See application file for complete search history.

(56) References Cited

U.S. PATENT DOCUMENTS

| 2010/0321092 | A1 | 12/2010 | Momota et al. |
| 2015/0294966 | A1* | 10/2015 | Weyers ............... H01L 27/0255 257/49 |
| 2021/0378084 | A1* | 12/2021 | Harada .............. H05K 7/20254 |

FOREIGN PATENT DOCUMENTS

| DE | 102014117954 A1 | 6/2016 |
| EP | 0702455 A2 | 3/1996 |
| EP | 1041634 A1 | 10/2000 |

* cited by examiner

*Primary Examiner* — Wasiul Haider
(74) *Attorney, Agent, or Firm* — Murphy, Bilak & Homiller, PLLC

(57) ABSTRACT

A single chip power semiconductor device includes: first and second load terminals; a semiconductor body integrated in the single chip and coupled to the load terminals and configured to conduct a load current along a load current path between the load terminals; a control terminal and at least one control electrode electrically connected thereto, the at least one control electrode being electrically insulated from the semiconductor body and configured to control the load current based on a control voltage between the control terminal and the first load terminal; a protection structure integrated, separately from the load current path, in the single chip and including a series connection of pn junctions with first semiconductor regions of a first conductivity type and second semiconductor regions of a second conductivity type. The series connection of the pn-junctions is connected in forward bias between the control terminal and the first load terminal.

27 Claims, 9 Drawing Sheets

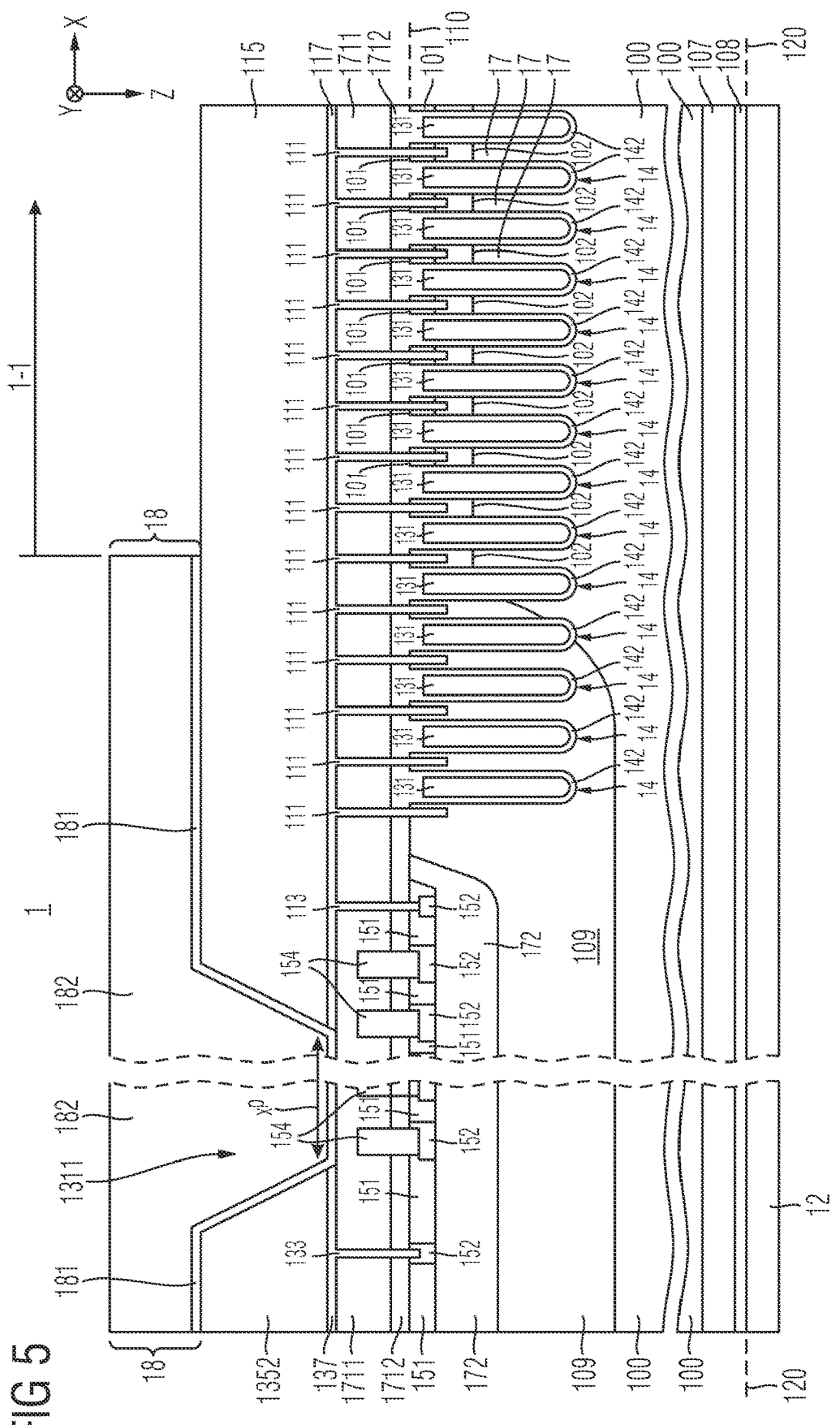

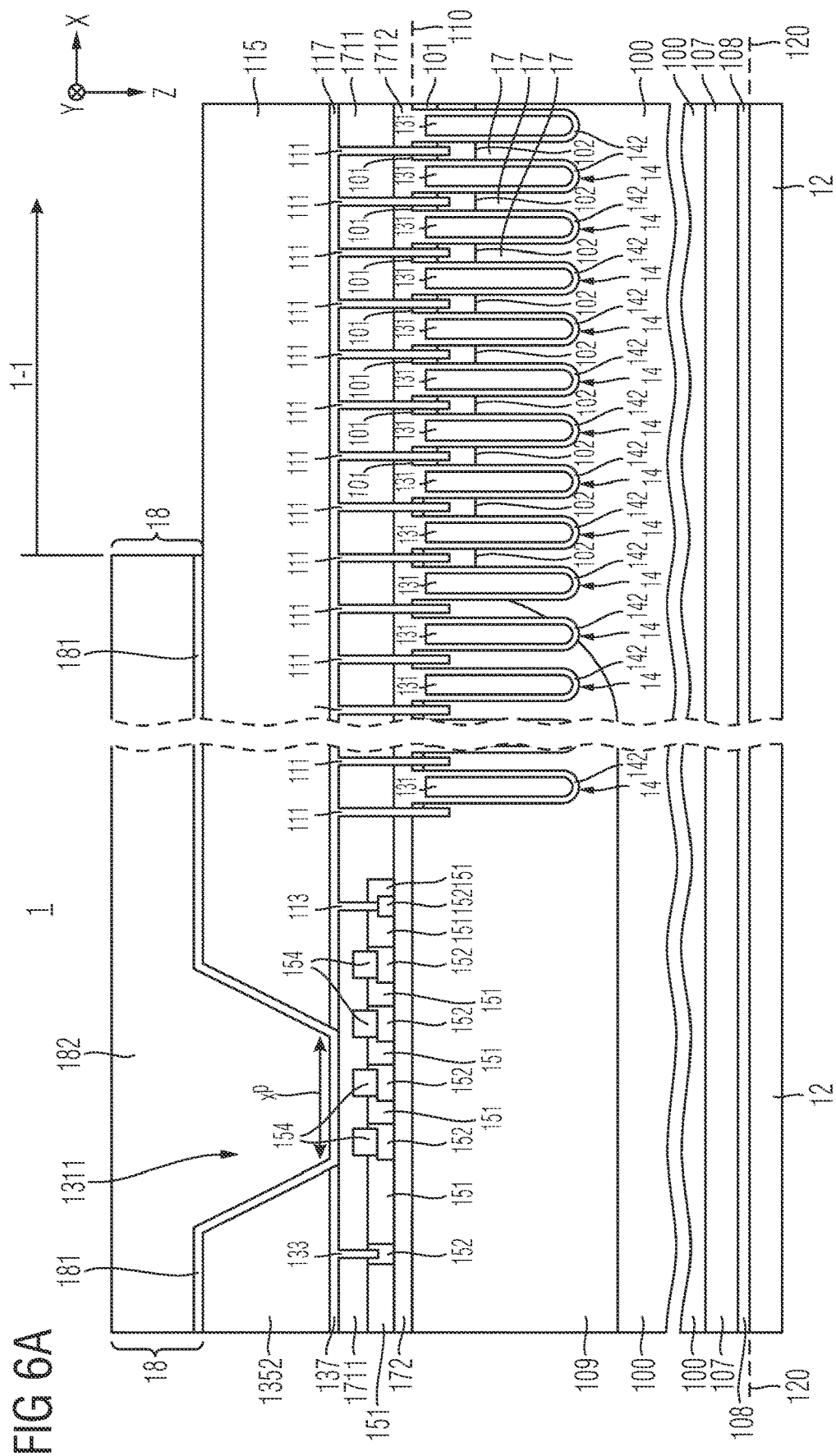

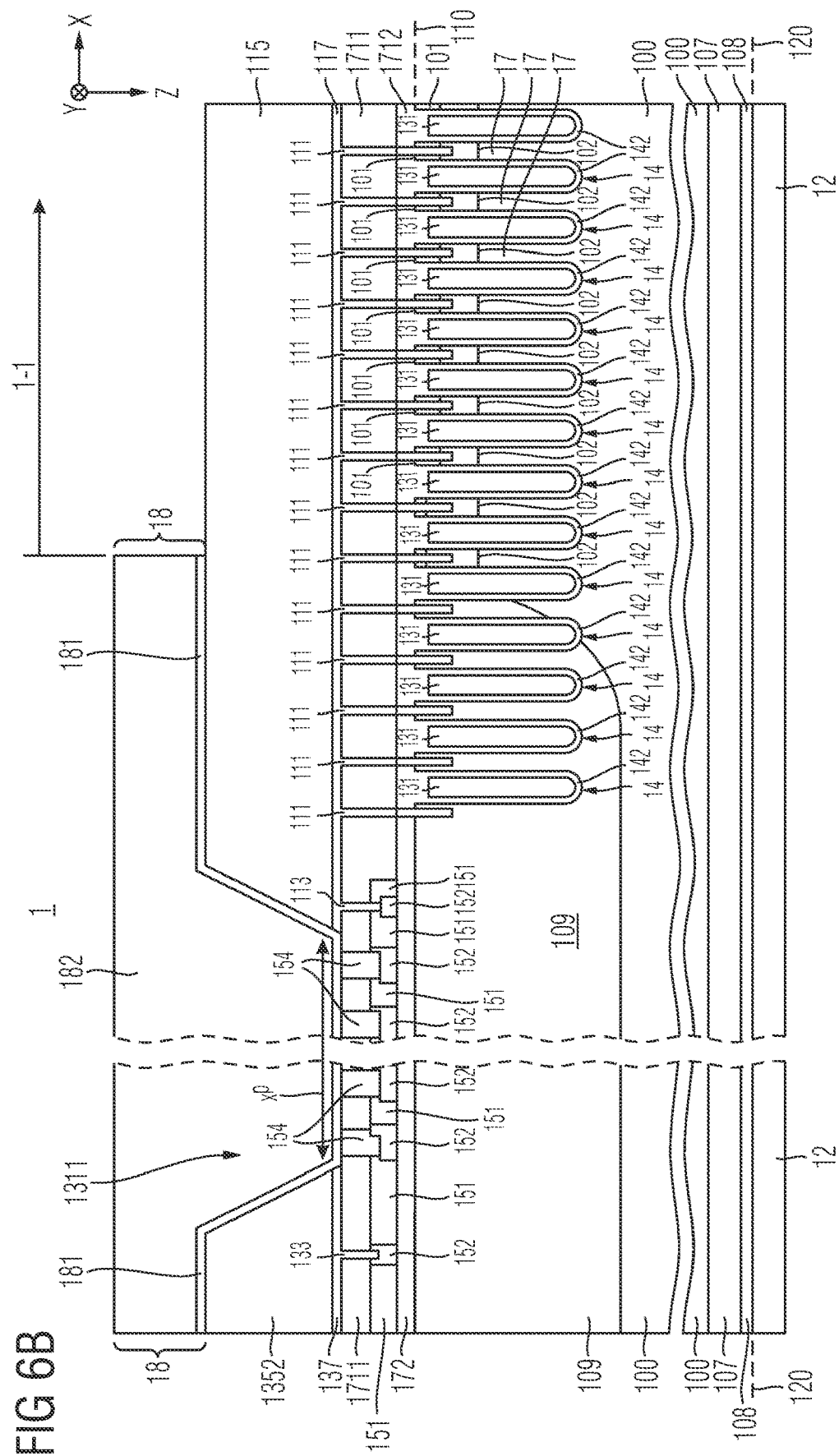

SHORT CIRCUIT PROTECTION STRUCTURE IN MOS-GATED POWER DEVICES

TECHNICAL FIELD

This specification refers to embodiments of a single chip power semiconductor device and to embodiments of a method of forming a single chip power semiconductor device. In particular, the specification is related to embodiments of a single chip power semiconductor device being a MOS-gated device, such as a MOSFET, an IGBT or a MOS gated diode, and to embodiments of a method of forming such device, wherein a protection structure is provided that limits a control voltage in certain situations.

BACKGROUND

Many functions of modern devices in automotive, consumer and industrial applications, such as converting electrical energy and driving an electric motor or an electric machine, rely on power semiconductor switches. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a forward load current along a load current path between two load terminals of the device.

Further, in case of a controllable power semiconductor device, e.g., a transistor or a so-called MOS gated diode, the load current path may be controlled by means of an insulated electrode, commonly referred to as gate electrode. For example, upon receiving a corresponding control signal from, e.g., a driver unit, the control electrode may set the power semiconductor device in one of a conducting state and a blocking state. In some cases, the gate electrode may be included within a trench of the power semiconductor switch, wherein the trench may exhibit, e.g., a stripe configuration or a needle configuration.

Some controllable power semiconductor devices exhibit the functionality that the load current through the semiconductor body during a short circuit (SC) event saturates which gives chance to turn off the device within a period of several µs before the device is thermally destroyed.

With the development of devices towards low conduction loss, the cell density and transconductance are increasing which leads to a higher current density in the short circuit mode and shorter allowable short circuit durations. In some applications, the short circuit duration is not defined due to the purpose of loss optimization. However, in some other applications, a short circuit duration of no more than e.g. 5 to 10 µs is desired. The definition of the short circuit capability may lead to increased power losses and application complexity.

The SC event is usually detected externally of the device by using load current and/or voltage measurement. Upon detection of the SC event, countermeasures may be initiated to limit the load current and/or, respectively, turn-off the device.

However, such SC event detection based on load current and/or voltage measurement may be too slow.

Furthermore, SC event detection based on load current and/or voltage measurement may increase the overall complexity of the device and its control.

SUMMARY

Aspects described herein relate to a protection structure integrated in the same chip as the power cell(s) of the power semiconductor device, but separate from the load current path. The protection structure is temperature responsive and thermally coupled to the load current path. In an SC event (where a high amplitude load current flows along the load current path), the device heats up, and the protection structure heats up accordingly. The resistance of the protection structure has a negative temperature coefficient and is connected in series (e.g., forward bias) between the control terminal and the load terminal of the device. Hence, in an SC event, the protection structure decreases in resistance and thereby limits a control voltage between the control terminal and a load terminal of the device.

According to an embodiment, a single chip power semiconductor device comprises: a first load terminal; a second load terminal; a semiconductor body integrated in the single chip and coupled to the first load terminal and the second load terminal and configured to conduct a load current along a load current path between said terminals; a control terminal and at least one control electrode electrically connected thereto, wherein the at least one control electrode is electrically insulated from the semiconductor body and configured to control the load current based on a control voltage between the control terminal and the first load terminal; a protection structure integrated, separately from the load current path, in the single chip and comprising a series connection of a plurality of pn-junctions with a plurality of first semiconductor regions of a first conductivity type and a plurality of second semiconductor regions of a second conductivity type. The series connection of the pn-junctions is connected in forward bias between the control terminal and the first load terminal.

According to an embodiment, a power semiconductor module comprises a number of integrated single chip power semiconductor devices, each of the one or more single chip power semiconductor devices of the module comprising: a first load terminal; a second load terminal; a semiconductor body integrated in the single chip and coupled to the first load terminal and the second load terminal and configured to conduct a load current along a load current path between said terminals; a control terminal and at least one control electrode electrically connected thereto, wherein the at least one control electrode is electrically insulated from the semiconductor body and configured to control the load current based on a control voltage between the control terminal and the first load terminal; a protection structure integrated, separately from the load current path, in the single chip and comprising a series connection of a plurality of pn-junctions with a plurality of first semiconductor regions of a first conductivity type and a plurality of second semiconductor regions of a second conductivity type. The series connection of the pn-junctions is connected in forward bias between the control terminal and the first load terminal According to an embodiment, a method of forming a single chip power semiconductor device is presented. The single chip power semiconductor device comprises: a first load terminal; a second load terminal; a semiconductor body integrated in the single chip and coupled to the first load terminal and the second load terminal and configured to conduct a load current along a load current path between said terminals; a control terminal and at least one control electrode electrically connected thereto, wherein the at least one control electrode is electrically insulated from the semiconductor body and configured to control the load current based on a control voltage between the control terminal and the first load terminal. The method comprises forming a protection structure integrated, separately from the load current path, in the single chip and comprising a series connection of a plurality of pn-junctions with a plurality of first semiconductor regions of a first conductivity type and a plurality of second semiconductor regions of a second conductivity type. The series connection of the pn-junctions is connected in forward bias between the control terminal and the first load terminal.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis is being placed upon illustrating principles of the invention. Moreover, in the figures, like reference numerals designate corresponding parts. In the drawings:

FIGS. 5-6B each schematically and exemplarily illustrate a section of a vertical cross-section of a single chip power semiconductor device in accordance with some embodiments.

DETAILED DESCRIPTION

Figure 1:
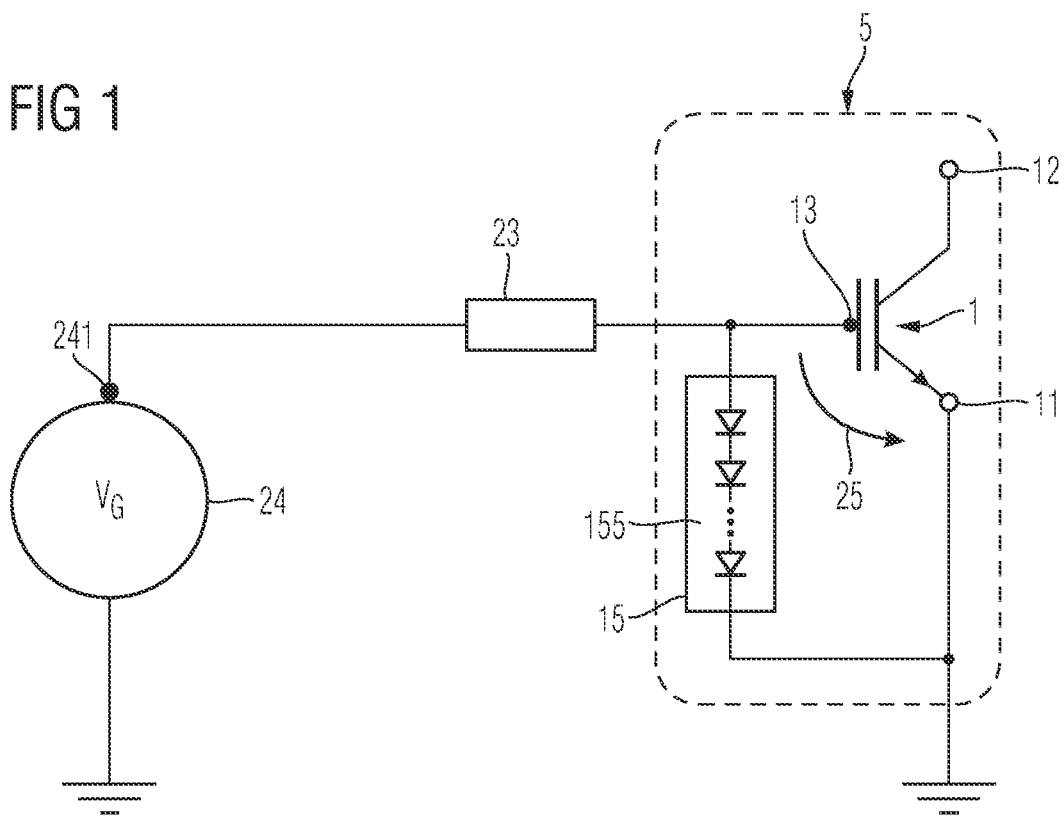
FIG. 1 schematically and exemplarily illustrates a power semiconductor module in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y. The extension direction Z is also referred to as "vertical direction Z" herein.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a single chip power semiconductor device exhibiting, e.g., a stripe cell configuration, e.g., a single chip power semiconductor device that may be used within a power converter or a power supply. Thus, in an embodiment, such single chip power semiconductor device can be configured to carry a load current that is to be fed to a load and/or, respectively, that is provided by a power source. For example, the single chip power semiconductor device may comprise a plurality of power semiconductor cells (herein also referred to as power cells), such as monolithically integrated diode cells, derivatives of a monolithically integrated diode cell, monolithically integrated IGBT cells and/or derivatives thereof, monolithically integrated MOSFET cells and/or derivatives thereof. Such diode/transistor cells may be integrated in the single chip, and one or more of such single chip may be integrated in a power semiconductor module. A plurality of such power cells may constitute a cell field that is arranged with an active region of the monolithically integrated IGBT cells and/or derivatives thereof, as will be explained in more detail below.

The term "single chip power semiconductor device" as used in this specification intends to describe a power semiconductor device on a single chip with high voltage blocking and/or high current-carrying capabilities. In other words, embodiments of the single chip power semiconductor device described herein are configured for high current, typically in the Ampere range, e.g., up to several Ampere or up to several ten or hundred Ampere, and/or high voltages, typically 100 V and above, e.g., up to at least 400 V or even more, e.g., up to at least 3 kV, or even up to 10 kV or more.

For example, the single chip power semiconductor device described below may exhibit a stripe or needle cell configuration and configured to be employed as a power component in a low-, medium- and/or high voltage application. One or more single chip power semiconductor devices may be integrated in a module so as to form a power semiconductor module, e.g., an IGBT module (or MOSFET module, or MOS gated diode module) for installation and use in a low-, medium- and/or high voltage application, such as major home appliances, general purpose drive, electric-drive train, servo drives, traction, higher power transmission facilities, etc.

For example, the term "single chip power semiconductor device" as used in this specification is not directed to a logic semiconductor device used for, e.g., storing data, computing data and/or other types of semiconductor based data processing.

FIG. 1 schematically and exemplarily illustrates, in a simplified manner, a power semiconductor module 5 with one or more single chip power semiconductor devices 1 accordance with one or more embodiments. For describing the configuration of the one or more single chip power semiconductor devices 1, it will also be referred to the remaining FIGS. 2-7B in the following.

Each of the one of the one or more single chip power semiconductor devices 1 may comprise a first load terminal 11 and a second load terminal 12. A semiconductor body 10 (cf. FIGS. 5-7B) is integrated in the single chip and coupled to the first load terminal 11 and the second load terminal 12 and configured to conduct a load current along a load current path between said terminals 11, 12. The single chip power semiconductor device 1 further comprises a control terminal 13 and at least one control electrode 131 (cf. FIGS. 5-7B) electrically connected thereto, wherein the at least one control electrode 131 is electrically insulated from the semiconductor body 10 and configured to control the load current based on a control voltage 25 between the control terminal 13 and the first load terminal 11.

Each of the one or more single chip power semiconductor devices 1 of the module 5 may exhibit an IGBT configuration (as exemplarily illustrated in FIGS. 5-7B), or a MOSFET configuration (in which case the exemplarily illustrated configurations in FIGS. 5-7B would simply differ in the dopant type of the semiconductor region 108), or a MOS gated diode configuration.

In an embodiment, the control terminal 13 is a gate terminal, and the first load terminal 11 is a source (or, respectively an emitter) terminal, and the second load terminal 12 is a drain (or, respectively a collector) terminal.

For example, the module 5 is controlled by a gate driver unit (not illustrated) providing a gate voltage $V_G$ 24, which can be in the range of several volts, e.g., depending on the configuration of the one or more single chip power semiconductor devices 1, within the range of 25 V . . . +25V, e.g., in the range of –8 V . . . +20 V or within a range of –5 V . . . 16 V, or, respectively, 0 V . . . 16 V. Again, the range of the applied gate voltage depends on the configuration of the one or more single chip power semiconductor devices 1. For example, the single chip power semiconductor device may also be a SiC-MOSFET and the range of the gate voltage is chosen accordingly.

The gate voltage $V_G$ 24 is applied between an output 241 of the gate driver unit and the electrical potential of the first load terminal 11, e.g., across an optional gate resistor 23 and the gate terminal 13, thereby providing said control voltage 25 between the control terminal 13 and the first load terminal 11. Hence, the control voltage 25 and the gate voltage 24 may be similar in magnitude, a difference between said voltages depending on the resistance of the optional gate resistor 23 and the control current flowing through this gate resistor 23.

In one embodiment, the gate resistor 23 may be implemented as an external resistor, like e. g. a discrete resistor. Additionally or alternatively, at least a part of the gate resistor 23 may be provided as an integrated resistor (not shown in FIG. 1) in the module 5. The gate resistor 23 may be used to limit the current flow from or to the gate driver unit providing said gate voltage 24 to the control electrode 131, e.g., to adjust current and/or voltage slopes during switching of the module 5.

In another embodiment, the gate driver unit may be realized as a current source with voltage limited to the value of control voltage 25, e.g., within the range of –25V . . . 25V, –8V . . . 20V or within a range of 0 . . . 16V. The gate driver may provide a control current flow to and from the control electrode 131 during turning-on and/or turning-off the power semiconductor module 5. The control current may be configured to shape the current and/or voltage slopes during switching of the module 5 by varying the current during the switching event.

For example, a first subrange of the gate voltage magnitude is associated with an ON state of the one or more single chip power semiconductor devices 1, and a second subrange of the gate voltage magnitude is associated with an OFF state of the one or more single chip power semiconductor devices 1, as it is typically the case for MOSFETs and IGBTs.

In an embodiment, the conductivity of the single chip power semiconductor device 1 depends on the amplitude of the actual control voltage 25; typically, the higher the amplitude of this control voltage 25, the higher the conductivity, and vice versa.

Hence, by limiting the maximum amplitude of the control voltage 25, the load current in the single chip power semiconductor device 1 can be limited.

At least one of the one or more single chip power semiconductor devices 1 comprises a protection structure 15 integrated, separately from the load current path, in the single chip. The protection structure 15 comprises a series connection 155 of a plurality of pn-junctions 153 (cf. FIG. 2) with a plurality of first semiconductor regions of a first conductivity type 151 (cf. FIG. 2) and a plurality of second semiconductor regions of a second conductivity type 152 (cf. FIG. 2). The series connection 155 of the pn-junctions 153 is connected in forward bias between the control terminal 13 and the first load terminal 11.

As indicated above, a further optional gate resistor (not illustrated) can be arranged between the control terminal 13 and the connection establishing the electrical connection of the series connection 155 of the pn-junctions 153 to the control terminal 13.

As illustrated in FIG. 1, the series connection 155 of the plurality of pn-junctions 153 (which can hence be a series connection of a corresponding plurality of diodes connected in forward bias between the control terminal 13 and the first load terminal 11) is subjected to the control voltage 25 applied between the control terminal 13 and the first load terminal 11.

In an embodiment, the protection structure 15 is thermally coupled to the load current path. For example, a thermal resistance and a thermal capacitance between the protection structure 15 and the load current path in the semiconductor body 10 define a thermal time constant of no greater than 1 µs. For example, the thermal resistance is in the range some hundred K/W (e.g., with respect to an area of 100 µm$^2$), and the thermal capacitance in the range of some $10^{-11}$ J/K (e.g., also with respect to an area of 100 µm$^2$), yielding a thermal constant lower than 1 µs, e.g., lower than 0.0.5 µs, or even lower than 0.3 µs.

In an embodiment, the protection structure 15 is configured to limit, by discharging the at least one control electrode 131, the control voltage 25 between the control terminal 13 and the first load terminal 11 to a value corresponding to the sum of the temperature dependent built-in voltages of the pn-junctions 153. Since the series connection 155 of the pn-junctions 153 is connected in forward bias between the control terminal 13 and the first load terminal 11, the control voltage 25 between the control terminal 13 and the first load terminal 11 cannot be greater than the total forward voltage of the series connection 155 of the pn-junctions 153, in accordance with an embodiment.

For example, the total forward voltage of the series connection 155 of the pn-junctions 153 decreases with increasing temperature of the series connection 155 of the pn-junctions 153. For example, since the protection structure 15 is thermally coupled to the load current path, in an SC event, where very high load currents and high voltages are observed which lead to increased temperature of the semiconductor body 10 conducting the load current, also the temperature of the series connection 155 of the pn-junctions 153 increases, yielding a reduced total forward voltage the of the series connection 155 of the pn-junctions 153.

That is, the pn-junctions 153 are formed by the plurality of the first semiconductor regions 151 and the plurality of the second semiconductor regions 152, wherein each pn-junction 153 has a built-in voltage with a negative temperature coefficient, in accordance with an embodiment.

For example, each of the plurality of the first semiconductor regions 151 and the plurality of the second semiconductor regions 152 is based on at least one of polycrystalline silicon and polycrystalline germanium. In this context, polycrystalline may also comprise amorphous and microcrystalline materials. Other materials may be used that ensure that each pn-junction 153 has a built-in voltage with a negative temperature coefficient. For example, in one embodiment, each of the plurality of the first semiconductor regions 151 and the plurality of the second semiconductor regions 152 is based on SiC.

In an embodiment, the total number of pn-junctions 153 amounts to at least three. The actually implemented number of pn-junctions 153 may be chosen based on control characteristic of the single chip power semiconductor device 1. For example, in case of a MOSFET/IGBT having a threshold voltage in the range of 4 . . . 7 V, it can be desirable to limit the control voltage 25 to approximately 10 to 20 V, yielding a higher number of pn-junctions 153, e.g., within the range of 20 to 40 pn-junctions 153 (e.g., each pn-junction has a respective built-in voltage of around 0.7 V at room temperature and a correspondingly lowered built-in voltage of e.g. 0.1 V at high temperature caused by an SC event). For example, in case of MOSFETs or IGBTs exhibiting a lower threshold voltage, e.g. 1 . . . 3 V, it can be desirable to limit the control voltage 25 to significantly lower values of only some Volts.

Presented herein are not only the single chip power semiconductor device 1 (some embodiments of which have been described above) and the power semiconductor module 5 comprising a number of integrated single chip power semiconductor devices (some embodiments of which have been described above), but also a method of producing such single chip power semiconductor device 1.

According to an embodiment, a method of forming a single chip power semiconductor device is presented. The single chip power semiconductor device comprises: a first load terminal; a second load terminal; a semiconductor body integrated in the single chip and coupled to the first load terminal and the second load terminal and configured to conduct a load current along a load current path between said terminals; a control terminal and at least one control electrode electrically connected thereto, wherein the at least one control electrode is electrically insulated from the semiconductor body and configured to control the load current based on a control voltage between the control terminal and the first load terminal. The method comprises forming a protection structure integrated, separately from the load current path, in the single chip and comprising a series connection of a plurality of pn-junctions with a plurality of first semiconductor regions of a first conductivity type and a plurality of second semiconductor regions of a second conductivity type. The series connection of the pn-junctions is connected in forward bias between the control terminal and the first load terminal.

Exemplary embodiments of this method correspond to the embodiment of the single chip power semiconductor device 1 described above.

Further exemplarily features will be now be described with respect to FIGS. 2-7B, wherein these feature analogously apply to each of the single chip power semiconductor device 1, the power semiconductor module and the method of processing a single chip power semiconductor device.

Figure 4:
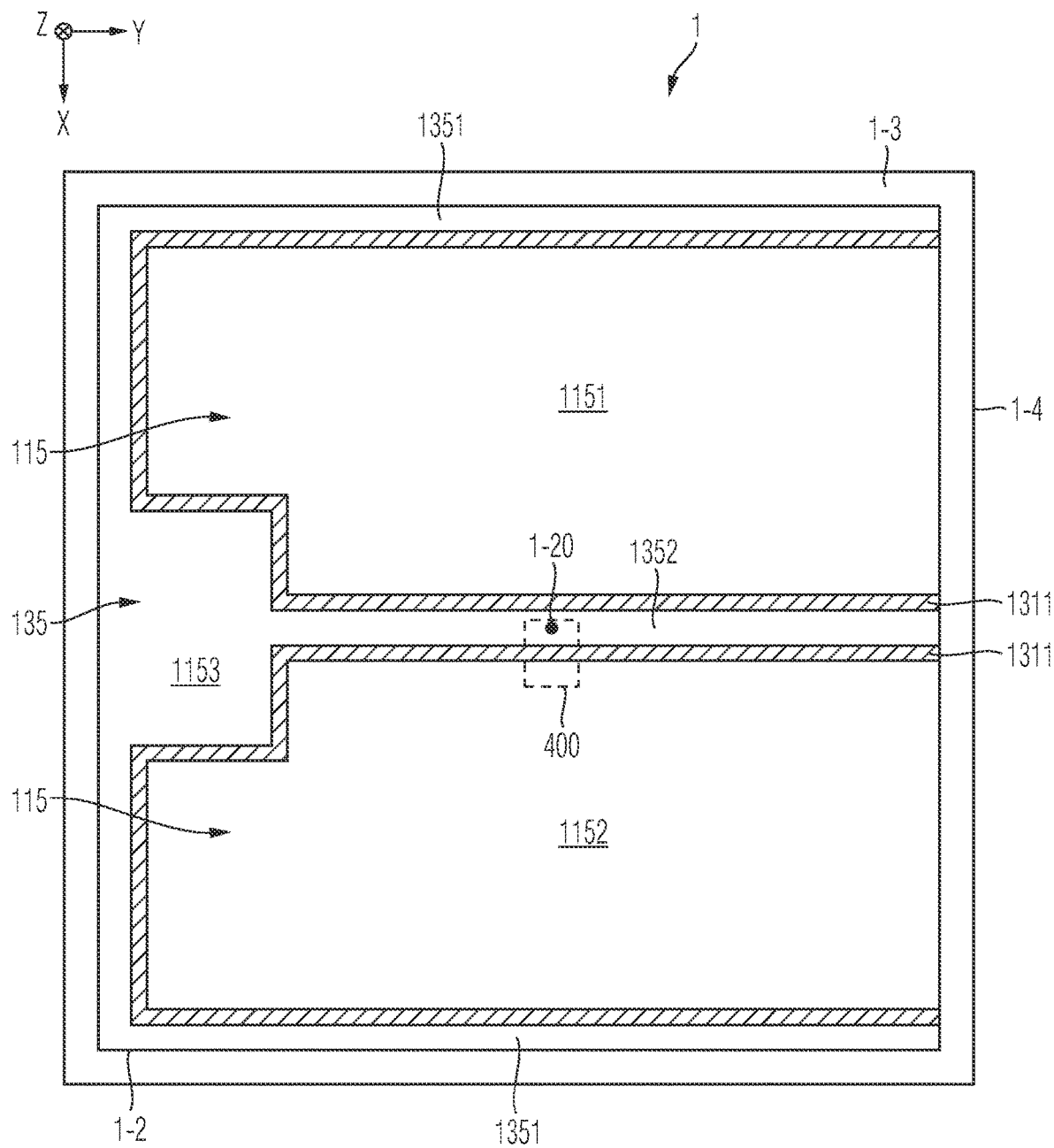
FIG. 4 schematically and exemplarily illustrates a section of a horizontal projection of a single chip power semiconductor device in accordance with one or more embodiments.

FIG. 4 illustrates a horizontal projection of an embodiment of the single chip power semiconductor device 1. The single chip power semiconductor device 1 comprises an active cell region 1-2 with one or more power cells 1-1 (cf. FIGS. 5-7B) integrated in the semiconductor body 10 and configured for conduction of the load current, an edge termination region 1-3 surrounding the active cell region 1-2 and being terminated by a chip edge 1-4.

As used herein, the terms "edge termination region" and "active region" are both associated with the respective technical meaning the skilled person typically associates therewith in the context of power semiconductor devices. That is, the active region 1-2 is primarily configured for load current conduction and (if applicable) switching purposes, whereas the edge termination region 1-3 primarily fulfills functions regarding reliable blocking capabilities, appropriate guidance of the electric field, sometimes also charge carrier drainage functions, and/or further functions regarding protection and proper termination of the active region 1-2.

Also referring to FIGS. 5-7B, the semiconductor body 10 may have a frontside 110 and a backside 120. The frontside 110 and the backside 120 may vertically terminate the semiconductor body 10. Hence, a thickness of the semiconductor body 10 is defined as the distance along the vertical direction Z between the frontside 110 and the backside 120. In the lateral directions, the semiconductor body 10 may be terminated by the chip edge 1-4. Furthermore, both the frontside 110 and the backside 120 may extend laterally along both the first lateral direction X and the second lateral direction Y. For example, both the frontside 110 and the backside 120 may form a respective horizontal surface of the semiconductor body 10. The thickness of the semiconductor body 10 may be the distance between the front side 110 and the backside 120 along the vertical direction Z in the active region 1-2, e.g., measured at a center 1-20 of the active region 1-2.

For example, both the control terminal 13 and the first load terminal 11 are at the semiconductor body frontside 110 and the second load terminal 12 is at the semiconductor body backside 120. The semiconductor body 10 is configured for conduction of the load current between the first load terminal 11 and the second load terminal 12, e.g., if the electrical potential at the second load terminal 12 is greater than the electrical potential at the first load terminal 11 and the device is in a turned-on state.

For example, the first load terminal 11 comprises a frontside metallization and/or the second load terminal 12 comprises a backside metallization. For example, the first load terminal 11 is a source (emitter) terminal and the second load terminal 12 is a drain (collector) terminal. At the frontside 110, the semiconductor body 10 may interface with the frontside metallization. At the backside 120, the semiconductor body 10 may interface with the backside metallization.

In an embodiment, the first load terminal 11 (e.g., said frontside metallization) laterally overlaps, that is, along the first lateral direction X and/or the second lateral direction Y and/or combinations thereof, with the active region 1-2. It shall be noted that the first load terminal 11 may interface with local contacts so as to electrically contact the semiconductor body 10 at the frontside 110. For example, as exemplary illustrated in FIGS. 5-7B, said local contacts can be established by means of contact plugs 111 penetrating through an upper insulation layer 171 so as to contact mesa portions of power cells 1-1.

Analogously, in an embodiment, the second load terminal 12 (e.g., said backside metallization) laterally overlaps, that is, along the first lateral direction X and/or the second lateral direction Y and/or combinations thereof, with the active region 1-2. It shall be noted that the second load terminal 12 is typically not structured but formed homogeneously and monolithically at the semiconductor body backside 120, e.g., so as to establish a laterally homogeneous contact (i.e., a contiguous contact surface) with the semiconductor body 10 at the backside 120. Such homogeneous structure may also be implemented in regions where the second load terminal 12 laterally overlaps with the edge termination region 1-3.

For example, the lateral boundary of the active region 1-2 is approximately defined by the lateral boundary of the outermost power cell(s) 1-1. Hence, the lateral boundary of the active region 1-2 may be defined at the frontside 110. This lateral boundary can be defined by an outermost source region(s) 101 (cf. explanation in more detail below). For example, all functional elements to enable conduction of the load current are present in a vertical projection of the active region 1-2 of the single chip power semiconductor device 1, e.g., including at least the first load terminal 11 (e.g., a frontside metal contact thereof, e.g., one or more of the contact plugs 111), source region(s) 101, a body region 102, a drift region 100, an emitter region 108 and the second load terminal 12 (e.g., a backside metal thereof), as will be explained in more detail below.

In an embodiment, the edge termination region 1-3 and the active region 1-2 may be substantially symmetrically arranged to each other, e.g., with respect to a central vertical axis crossing the center of the single chip power semiconductor device 1.

For example, the first load terminal 11 may comprises a source pad structure 115 (e.g., forming or, respectively, as part of said frontside metallization) laterally overlapping with the active region 1-2. The control terminal 13 may comprises a control pad structure 135. Both the source pad structure 115 and the control pad structure 135 are arranged above a frontside 110 of the semiconductor body 10. For example, both pad structures 115, 135 are configured to be contacted by chip-external contacting means, such as bond wires or the like.

Figure 3:
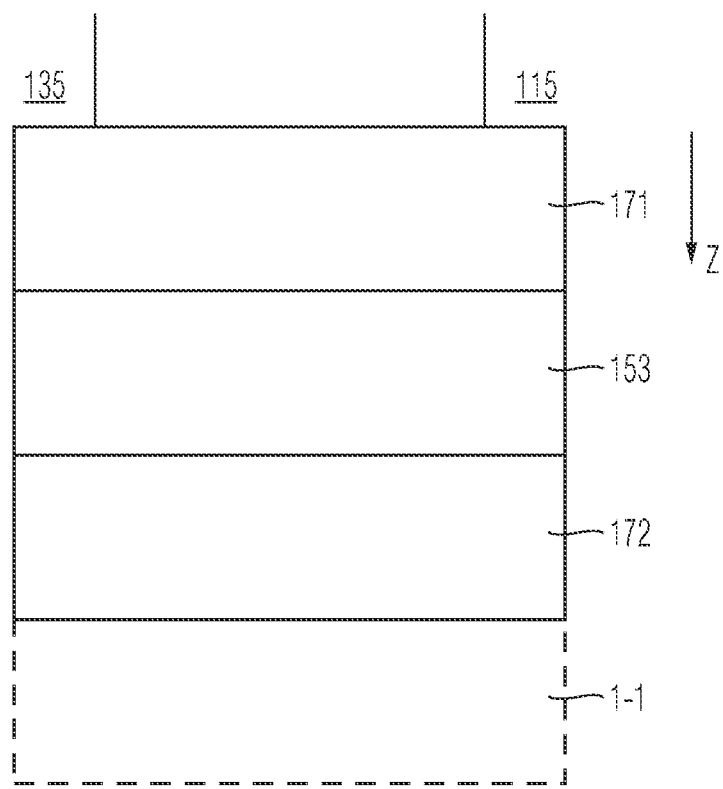
FIG. 3 schematically and exemplarily illustrates a vertical position of a protection structure of a single chip power semiconductor device based on a stack diagram in accordance with one or more embodiments.

At least an upper insulation layer 171 of the single chip may separate, along the vertical direction Z, both the source pad structure 115 and the control pad structure 135 from the frontside 110 of the semiconductor body 10, as it is also schematically illustrated in FIG. 3 and shown in FIGS. 5-7B.

As further illustrated in FIG. 4, the control pad structure 135 may comprise at least one of a control runner 1351 and a control finger 1352 being separated from the source pad structure 115 by a gap region 1311. As shown in FIG. 4, the one or more control runners extend in proximity to the edge termination region 1-3, whereas the control finger 1352 extends through the center 1-20 of the active region 1-2. Both the control runner(s) 1351 and the control finger(s) 1352 are configured to provide the control voltage to the plurality of power cells 1-1 in the active cell region 1-2. Both the control runner(s) 1351 and the control finger(s) 1352 can seamlessly merge with a control landing pad 1353 of the control pad structure 135.

In an embodiment, at least one of the one or more control runners 1351 and the one or more control fingers 1352 extends between two adjacent source pads 1151, 1152 of the source pad structure 115, as illustrated in FIG. 4. Of course, the source pads 1151 and the control runner(s) 1351/the control finger(s) 1352 must be electrically insulated from each other. For this reason, these regions are laterally separated from each other by means of said gap region(s) 1311. Accordingly, since the control finger 1352 may for example extend through the center 1-20 of the active region 1-2, also said gap region(s) 1311 may be in proximity to the center 1-20 of the active region 1-2.

The center 1-20 of the active region 1-2 is typically also close to the maximum of the load current density (wherein, of course, this may depend on the actual distribution of the density of the power cells 1-1 in the active region 1-2).

Hence, the center 1-20 of the active region 1-2 is typically also close to the maximum temperature of the device 1.

Figure 2:
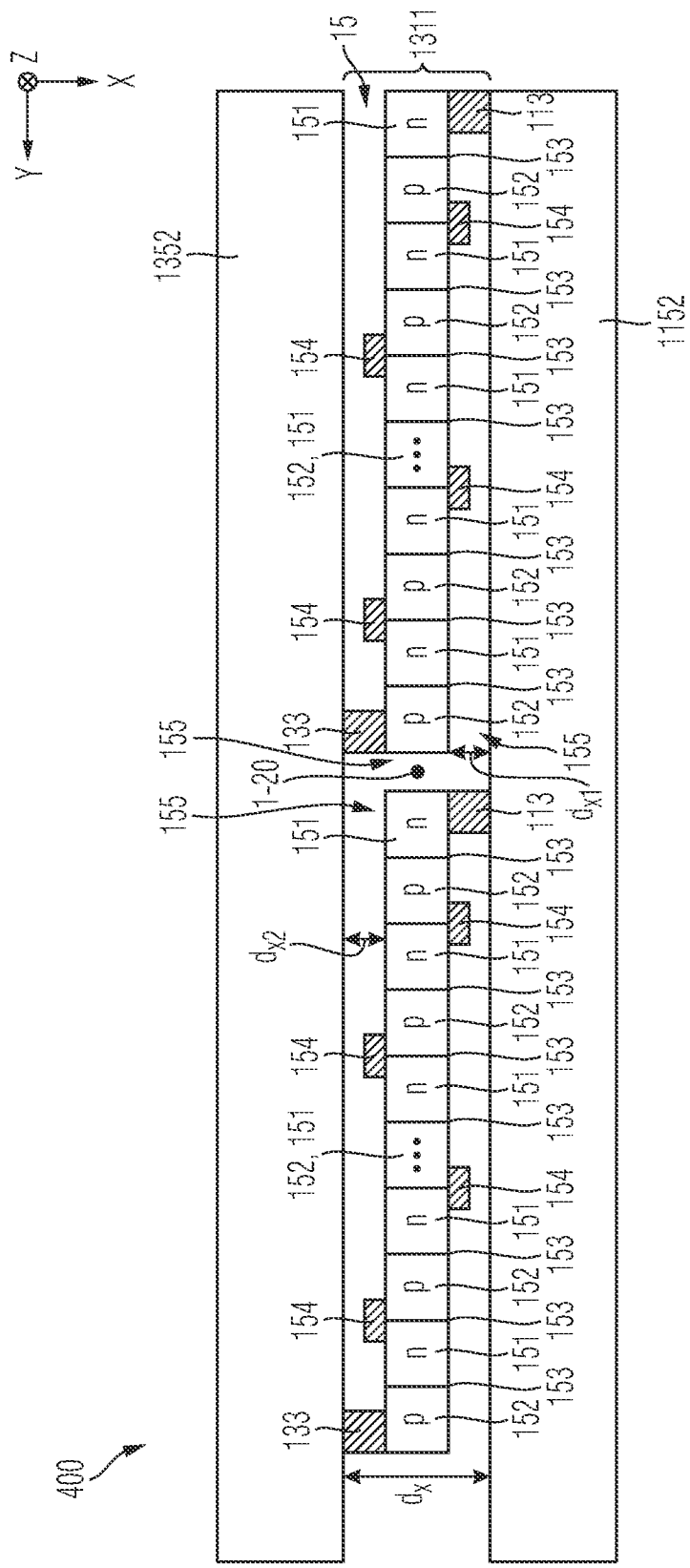
FIG. 2 schematically and exemplarily illustrates a protection structure of a single chip power semiconductor device in accordance with one or more embodiments.

Now also referring to FIG. 2, which schematically illustrates a horizontal projection of the portion 400 identified with the dotted line in FIG. 4, in an embodiment, the series connection 155 of the plurality of pn-junctions 153 with the plurality of the first semiconductor regions 151 and the plurality of the second semiconductor regions 152 extends into a region corresponding to a vertical projection of the gap region 1311. Said region corresponding to the vertical projection of the gap region 1311 may hence at least partially located in a central portion laterally closer to the center 1-20 of the active region 1-2 as compared to the chip edge 1-4. Such laterally positioning of the protection structure 15 yields a good thermal coupling of the series connection 155 of the plurality of pn-junctions 153 to the load current path.

In an embodiment, a first protection structure contact plug 113 extends from the source pad structure 115 (e.g., from the second source pad 1152) through the upper insulation layer 171 (cf. FIG. 3 and FIGS. 5-7B) and establishes an electrical connection between the source pad structure 115 and at least one of the first semiconductor regions 151 (e.g., only with the last one of the first semiconductor regions 151). Further, a second protection structure contact plug 133 extends from the control pad structure 135 (e.g., from said control finger 1352) through the upper insulation layer 171 and establishes an electrical connection between the control pad structure 135 and at least one of the second semiconductor regions 152 (e.g., only with the first one of the second semiconductor regions 151). Eventually present highly doped contact implantation regions are not separately illustrated in the drawings.

For example, at least a portion of the pn-junctions 153 is located closer to the load current path, e.g., the active cell region 1-2 (e.g., then center 1-20 thereof), as compared to the electrical connection (i.e., said second protection structure contact plug 133) connecting the series connection 155 of the pn-junctions 153 to the control terminal 13. For example, at least a portion of the pn-junctions 153 is located closer to the load current path, e.g., the active cell region 1-2, than the adjacent portion of the gate finger 1352.

Furthermore, as schematically illustrated in FIG. 2, the protection structure 15 comprises a plurality of short circuit elements 154 short circuiting np-junctions 156 formed by pairs of a respective first semiconductor region 151 and an adjacent second semiconductor region 152, in accordance with an embodiment. The short circuit elements 154 may be based on tungsten, for example. Other possible implementations of the short circuit elements 154 are based on one or more of titanium and cobalt, or, respectively, on highly doped polysilicon plugs, optionally in combination with a silicide (such as TiSi2, CoSi2 and the like).

The gap region 1311 may exhibit a gap width dx of some µm, e.g., in the range of 1 µm to 100 µm (c.f. also FIG. 7B) along a lateral direction, such as the first lateral direction X. At least a portion of the first semiconductor regions 151 and at least a portion of the second semiconductor regions 152 may extend into a region overlapping with a portion corresponding to a vertical projection of the gap region 1311. In an embodiment, the semiconductor regions 151 and the second semiconductor regions 152 may not overlap with regions corresponding to vertical projections of the control pad structure 135 and the source pad structure 115, but are laterally spaced apart therefrom by distances dx1, dx2, respectively, as illustrated in FIG. 2. In other embodiments (cf. FIGS. 5-7B), there may be an overlap.

In an embodiment, the short circuit elements 154 do not overlap with regions corresponding to vertical projections of the control pad structure 135 and the source pad structure 115, but are laterally spaced apart therefrom.

For example, in an embodiment, each of the first semiconductor regions 151 and the second semiconductor regions 152 has a lateral extension (e.g., along the first lateral direction X) amounting to at least the gap width dx. Hence, the lateral extension of each of the first semiconductor regions 151 and the second semiconductor regions 152 may amount to some µm, e.g., said lateral extension is in the range of 1 µm to 100 µm.

In an embodiment, the protection structure 15 includes two or more series connections 155, each having a respective plurality of pn-junctions 153 with a plurality of first semiconductor regions 151 and a plurality of second semiconductor regions 152, the series connections 155 being connected in parallel to another, as illustrated in FIG. 2. The larger the individual cross sections of the individual pn-junctions 153 and/or the individual short circuit elements 154, the larger is the current through a single series connection 155 at a certain value of the control voltage 25. Typically, the more parallel connected series connections 155 are provided, the faster the discharge of the of the control electrodes 131 will happen.

With regards to the vertical position of the protection structure 15, it is additionally referred to the conceptual FIG. 3. For example, at least an upper insulation layer 171 of the single chip separates, along the vertical direction Z, both the source pad structure 115 and the control pad structure 135 from the frontside 110 of the semiconductor body 10. As explained above, the protection structure 15 is integrated in the single chip but arranged separate from the load current path. For example, at least a lower insulation layer 172 isolates the series connection 155 of the plurality of pn-junctions 153 with the plurality of the first semiconductor regions 151 and the plurality of the second semiconductor regions 152 from the semiconductor body 10.

In an embodiment, both the source pad structure 115 and the control pad structure 135 are arranged above the upper insulation layer 171. Furthermore, the series connection 155 of the plurality of pn-junctions 153 with the plurality of the first semiconductor regions 151 and the plurality of the second semiconductor regions 152 is arranged at least partially below the upper insulation layer 171. In addition, the series connection 155 of the plurality of pn-junctions 153 with the plurality of the first semiconductor regions 151 and the plurality of the second semiconductor regions 152 is arranged entirely above the lower insulation layer 172. Furthermore, the power cells 1-1 may extend further along the vertical direction Z as compared to the lower insulation layer 172.

The configuration of the lower insulation layer 172 in terms of material and dimension may influence the thermal resistance and the thermal capacitance present between the series connection 155 of the plurality of pn-junctions 153 and the load current path.

FIG. 5 schematically and exemplarily illustrates a section of a vertical cross-section of a single chip power semiconductor device 1 in accordance with some embodiments. To begin with, the configuration of the active cell region 1-2 with the plurality of power cells 1-1 shall be briefly explained:

The single chip power semiconductor device 1 comprises a drift region 100 of the first conductivity type formed in the semiconductor body 10. A body region 102 of the second conductivity type is formed in mesa portions of the semiconductor body 10. At least portions of the body region 102 are electrically connected to the first load terminal 11, e.g., to the source pad structure 115. The body region 102 forms pn-junctions to subsections of the mesa portions 17 of the first conductivity type. Said subsections of the mesa portions 17 may be filled with portions of the drift region 100 or higher doped regions of the first conductivity type.

The body region 102 may be arranged in electrical contact with the first load terminal 11, e.g., by means of the contact plugs 111. In each power cell 1-1, there can furthermore be provided at least one source region 101 of the first conductivity type arranged in electrical contact with the first load terminal 11, e.g., also by means of the contact plugs 111. A major part of the semiconductor body 10 is formed as the drift region 100 of the first conductivity type, which may interface with the body region 102 and form a pn-junction therewith. The body region 102 isolates the source regions 101 from the drift region 100.

Further along the vertical direction Z, the drift region 100 may interface with a field stop layer 107 of the first conductivity type, and the field stop layer 107 may interface with an emitter region 108 that is coupled to the second load terminal 12. Depending on the device configuration, the emitter region 108 can be either of the first conductivity type (e.g., in case of a MOSFET configuration) or of the second conductivity type (e.g., in case of an IGBT configuration) or may comprise both regions of the first conductivity type and regions of the second conductivity type (e.g., in case of an RC IGBT configuration).

Upon receipt of a corresponding control voltage, e.g., provided by the non-illustrated gate driver unit, each control electrode 131 can induce an inversion channel in a section of the body region 102 adjacent to the respective control electrode 131. Thus, each of the number of power cells 1-1 may be configured for conducting at least a portion of the load current between the first load terminal 11 and the second load terminal 12.

The control electrodes 131 may be arranged in trenches 14 and insulated from the semiconductor body 10 by respective trench insulators 142. The trenches 14 may exhibit a stripe configuration or a needle configuration. The semiconductor body portions laterally confined by the trenches being herein referred to as mesa portions. Not every mesa portion must include a source region 101 (or, a source region 101 electrically connected to the first load terminal 11), and/or not every mesa portion must be electrically connected to the first load terminal by means of a corresponding contact plug 111, and, furthermore, not every trench 14 must include a control electrode 131, but may include a trench electrode 141 connected to another electrical potential or being electrically floating, such that various cell configurations, i.e., trench-mesa-patterns, can be designed for the power cells 1-1. However, the actual configuration of the power cells 1-1 is not relevant for the function of the herein described protection structure 15.

Rather, the above described basic configuration of the MOS controlled power cells 1-1 is as such known to the skilled person, and the present specification employs the term "MOS controlled power cell" within the scope of the technical meaning the skilled person typically associates therewith.

In an embodiment, the single cell power semiconductor device 1 further comprises a well region 109 of the second conductivity type and electrically connected with the first load terminal 11, wherein the well region 109 extends below the protection structure 15 and into said portion of the semiconductor body 10 corresponding to the vertical projection of the gap region 1311. For example, the well region 109 is electrically contacted by means of one or more of the contact plugs 111 and hence be electrically connected to the first load terminal 11. The well region 109 may extend from said portion corresponding to the vertical projection of the gap region 1311 towards the power cells 1-1, but may be laterally separated from the power cells 1-1 by means of at least one of the trenches 14.

In an embodiment, the protection structure 15 is arranged between the upper insulation layer 171 and the lower insulation layer 172. The lower insulation layer 172 may interface with the well region 109. Hence, the well region 109, which is electrically connected to the first load terminal 11 (which is often connected to fixed potential, such as Ground), may fulfill an electrical shielding function by reducing the capacitive coupling to varying electrical potentials, such as the potential of the second load terminal 12.

By means of the material and/or the dimension, e.g., the thickness of the lower insulation layer 172, the thermal time constant of the thermal coupling between the protection structure 15 and the load current path can be influenced. For example, a greater thickness of the lower insulation layer 172 yields a greater thermal time constant due to increased thermal resistance and thermal capacitance (cf. FIGS. 5, 7A, and a lower thickness of the lower insulation layer 172 yields a lower thermal time constant due to decreased thermal resistance and thermal capacitance (cf. FIGS. 6A-B, 7B).

The upper insulation layer 171 that separates both the control pad structure 135 and the source pad structure 115 from the frontside 110 of the semiconductor body 10 may comprise a first sublayer 1711 (e.g., an intermediate oxide layer) and a second sublayer 1712 (e.g., a layer of deposited silicon dioxide) below thereof. The contact plugs 111 penetrate the upper insulation layer 171 to electrically connect the mesa portions with the first load terminal 11. For example, a first conductive layer 117 and a second conductive layer 137 are provided on top of the upper insulation layer 171, and the source pad structure 115 is arranged on top of (e.g., in contact with) the first conductive layer 117, whereas the control pad structure 135 is arranged on top of (e.g., in contact with) the second conductive layer 137. The contact plugs 111 may extend from the first conductive layer 117 along the vertical direction Z through the upper insulation layer 171 and may be made out of the same material as the first conductive layer 117, which can for example be tungsten (e.g., together with Ti and/or TiN).

Similar to the contact plugs 111, both the first and the second protection structure contact plugs 113, 133 that electrically connect the series connection 155 of the pn-junctions 153 to the source pad structure 115/the control pad structure 135, respectively, may extend from the first conductive layer 117 (or, respectively, from the second conductive layer 137) along the vertical direction Z through the upper insulation layer 171 and may be made out of the same material as the first conductive layer 117 or respectively, the second conductive layer 137. For example, both the first and the second protection structure contact plugs 113, 133 extend for at least 1 µm along the vertical direction Z, e.g., within the range of 350 nm to 2300 nm.

In an embodiment, both the contact plugs 111 (that electrically connect the source regions 101 of the power cells 1-1 with the first load terminal 11) and at least one of the first and the second protection structure contact plugs 113, 133 exhibit a common vertical extension range of at least 500 nm, of at least 1 µm or of at least 1.5 µm.

Furthermore, in an embodiment, both the contact plugs 111 (that electrically connect the source regions 101 of the power cells 1-1 with the first load terminal 11) and at least one of the first and the second protection structure contact plugs 113, 133 are made out of the same material, which can for example be aluminum Al, copper Cu or alloys of aluminum or copper, for example AlSi, AlCu, or AlSiCu. According to other embodiments, the contact plugs 111 may contain one, two, three or more sub-layers, each sub-layer containing, as a main constituent, at least one of nickel Ni, titanium Ti, silver Ag, gold Au, tungsten W, platinum Pt, tantalum Ta and palladium Pd. For example, a sub-layer may contain a metal nitride or a metal alloy containing Ni, Ti, Ag, Au, W, Pt, Cobalt and/or Pd.

Additionally or alternatively, also both the contact plugs 111 (that electrically connect the source regions 101 of the power cells 1-1 with the first load terminal 11) and at least one of the plurality of short circuit elements 154 (that short circuit np-junctions 156 formed by pairs of a respective first semiconductor region 151 and an adjacent second semiconductor region 152) exhibit a common vertical extension range of at least 300 nm, of at least 600 nm or of at least 1 µm.

Furthermore, in an embodiment, both the contact plugs 111 (that electrically connect the source regions 101 of the power cells 1-1 with the first load terminal 11) and at least one of the plurality of short circuit elements 154 (that short circuit np-junctions 156 formed by pairs of a respective first semiconductor region 151 and an adjacent second semiconductor region 152) are made out of the same material, examples of which having been identified above. In an embodiment, the material of the short circuit elements 154 and the contact plugs 111 may be formed at least partially by using the same process steps.

In an embodiment, the short circuit elements 154 have a shorter vertical extension than the contact plugs 111. This is for example illustrated in FIGS. 5-7B.

Both the source pad structure 115 and the control pad structure 135 may at least partially be covered by an insulation structure 18, which may comprise a first sublayer 181 (e.g., a thin dielectric film, such as a silicon nitride in contact with the pad structures 135 and a second sublayer 182 (e.g., a relatively thick imide layer) above the first sublayer 181. The insulation structure 18 may form the outermost insulation structure and serve as a passivation structure for the semiconductor device.

In accordance with the embodiment schematically illustrated in FIG. 5, the protection structure 15 is arranged below the first sublayer 1711 and below the second sublayer 1712 of the upper insulation layer 171. The lower insulation layer 172 may for example be a so-called field oxide, e.g., with a thickness in the range of 10 nm to 500 nm. Said lower insulation layer 172 may interface with the well region 109.

In the variants illustrated in FIGS. 6A-B, the protection structure 15 is arranged within the first sublayer 1711 and above the second sublayer 1712 of the upper insulation layer 171. The lower insulation layer 172 may for example be a so-called gate oxide, e.g., with a thickness in the range of 5 nm to 200 nm. In this embodiment, the lower insulation layer 172 may for example exhibit substantially the same thickness as the trench insulators 142.

Figure 7A:
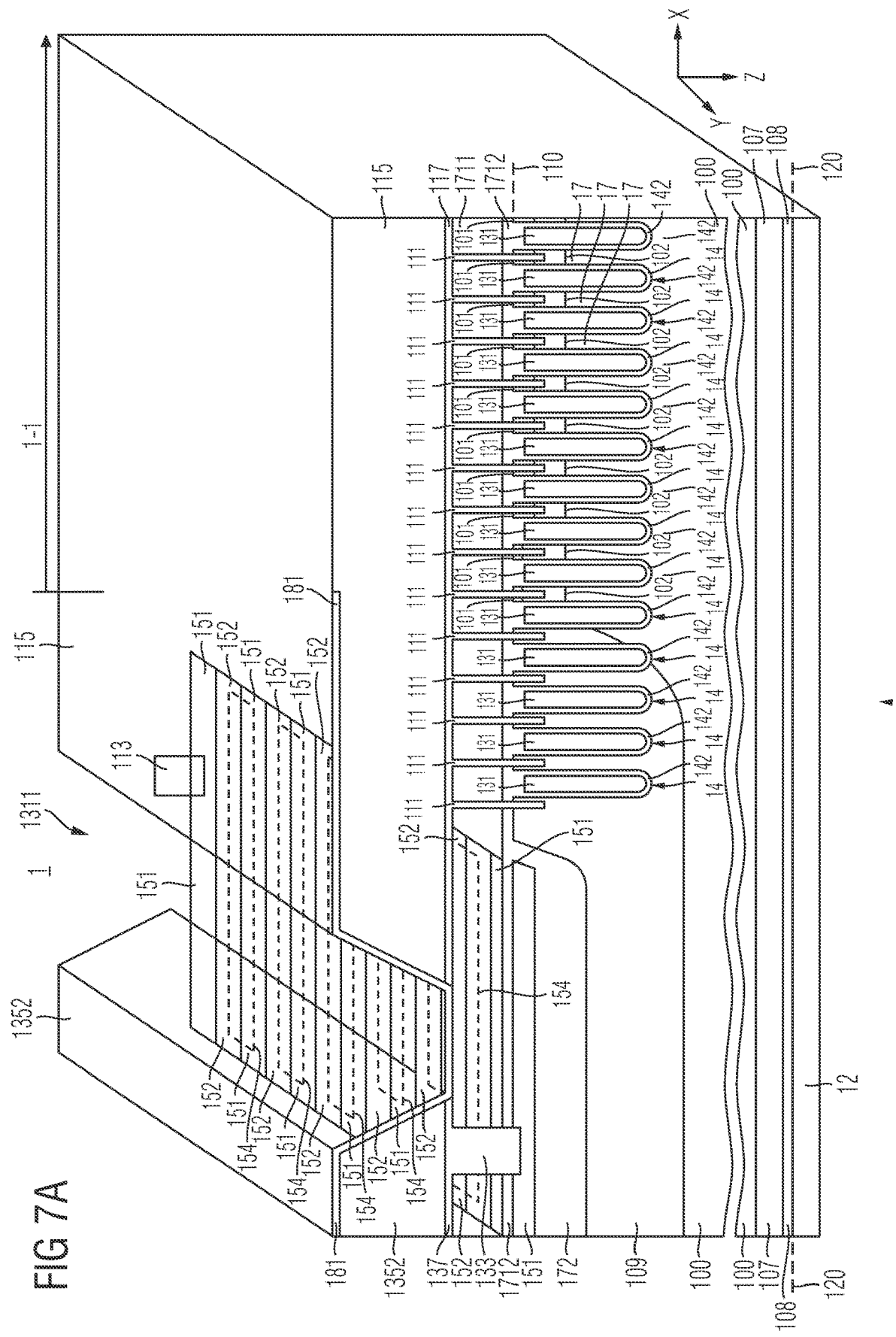
FIGS. 7A-B both schematically and exemplarily illustrate a section of a perspective projection of a single chip power semiconductor device in accordance with some embodiments.

As schematically illustrated in FIGS. 6A and 7A, at least one of the plurality of short circuit elements 154 (that short circuit np-junctions 156 formed by pairs of a respective first semiconductor region 151 and an adjacent second semiconductor region 152) may be arranged in a portion not corresponding to the vertical projection of the gap region 1311, e.g., so as to laterally overlap with at least one of source pad structure 115 and the control pad structure 135.

Figure 7B:
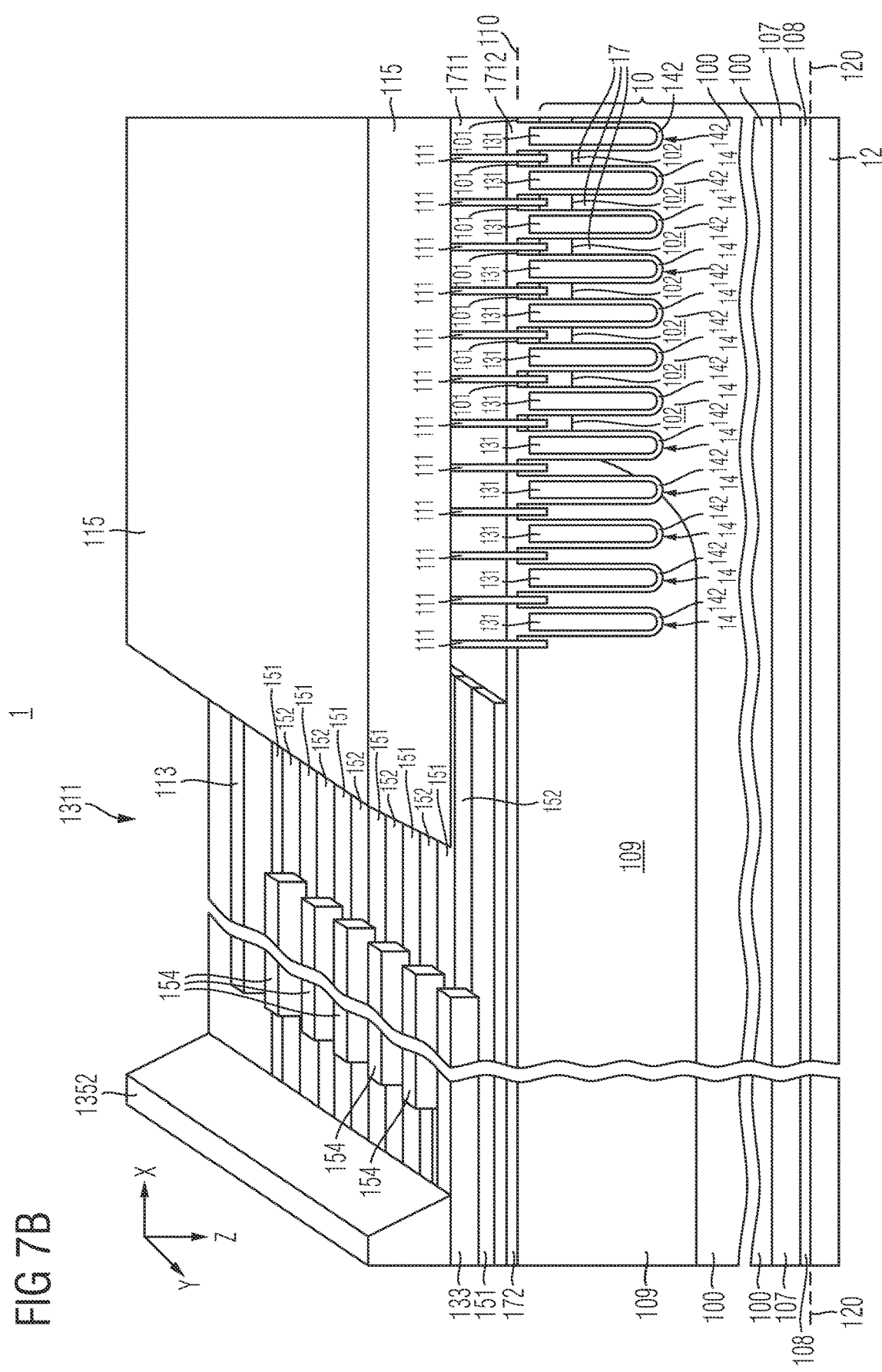

As schematically illustrated in FIGS. 6B and 7B, each of the plurality of short circuit elements 154 (that short circuit np-junctions 156 formed by pairs of a respective first semiconductor region 151 and an adjacent second semiconductor region 152) is arranged in the portion corresponding to the vertical projection of the gap region 1311, e.g., so as to not laterally overlap with the source pad structure 115 or the control pad structure 135.

Of course, in accordance with the embodiments described, the first protection structure contact plug 113 may laterally overlap with the source pad structure 115, and/or the second protection structure contact plug 133 may laterally overlap with the control pad structure 135.

Furthermore, it should be noted that unlike the illustrations in FIGS. 5-6B, the semiconductor portion below second protection structure contact plug 133 and laterally overlapping with the control pad structure 135 could be entirely a semiconductor region of the second conductivity type such that the illustrated first short circuit element 154 ("first" referring to the first one along a direction of the extension of structure 15 from second protection structure contact plug 133 towards the first protection structure contact plug 113) can be omitted, as the first junction along said direction would be a pn-junction and not a np-junction.

The above described embodiments included the following recognitions:

For example, compared to thyristors, IGBTs and MOSFETs have the favorable functionality that the current in short circuit (SC) event goes into saturation which gives chance to turn off the device in several µs before the device is destroyed thermally. With the development of devices towards low conduction loss, the cell density and transconductance are increasing which leads to a higher current density in the short circuit mode and shorter allowable short circuit time. In some products, the short circuit time is not defined due to the purpose of loss optimization. However, in some other applications, a short circuit time of 5-10 µs is desired. The definition of the short circuit capability leads to the increased power losses and application efforts.

In accordance with known principles, the short circuit event can be detected externally by using current and/or voltage measurement, which may however be too slow and requires additional efforts in the applications. For example, to limit the short circuit current and energy dissipated, the maximum allowed gate (i.e., control) voltage could be constantly limited, leading to increased turn-on and on-state losses. Furthermore, the channel width of the MOS control head can be limited with the same negative effects.

In accordance with one or more embodiments described herein, it is proposed to protect the device in short circuit events by limiting the control voltage automatically at extreme high junction temperature. The protection structure can be integrated directly besides the active cell field and below the surface passivation of the main device and connects the gate and emitter of the main device. The protection structure may sense the high temperature in short circuit mode and limits the short circuit current by reducing the control voltage. The protection structure may use monolithically integrated polysilicon diodes. The electro-thermal response of such diodes is much faster as compared to externally current and/or voltage measurement methods, which gives the chip design more freedom in the loss optimization. On the other hand, the integrated diodes do not rely on external sensors, which increases the reliability of the protection function.

For example, in accordance with one or more embodiments described herein, a functionality of the protection structure makes use of the fact that during short circuit the power device (IGBT, MOSFET, based on Si or SiC) is rapidly heated up to temperatures beyond the maximum allowed operational junction temperature (e.g., 175° C.). The protection structure may make use of sufficiently many integrated polysilicon diodes connected in series and connected between gate and source or emitter of the power device.

For example, the number of polysilicon diodes can be chosen in a way that their leakage current is below a certain limit at maximum allowed control voltage and maximum allowed junction temperature. At further raised junction temperature during short circuit, the built-in voltages of the polysilicon diodes will drop, leading to increased current flow from gate to source or emitter and discharging of the gate thus reducing the gate source voltage and the short circuit current. For example, between around 3 and 80 pn junctions in total may be connected in series to provide functionality with the operational control voltages that are common nowadays (e.g., 10 . . . 20 V, or also below 10V or below 5V).

For example, when turning-on on high capacitive loads, such as long cables, also high and elongated current peaks may occur in the power device used for the turn-on process. Conventional methods (such as DESAT, di/dt-measurement or the like) typically have an issue to discriminate between "normal" capacitive peak current and "real" short circuit current.

In accordance with one or more embodiments described herein, the above described discrimination problem is solved by elongating, based on the protection structure, the response time before turning-off the power device after a suspicious signal is detected. Then, it is possible to wait whether the suspicious signal vanishes of its own. However, this requires long short circuit withstand times which are no longer compatible with modern power devices with high power density.

In accordance with one or more embodiments described herein, such waiting time prevents false triggering and/or increases ease of use of the power device and increases availability of the power electronic application. For example, one or more embodiments described herein use device temperature as trigger and only in case of excessive capacitive loads or at short circuit the protection structure will trigger automatically, hence avoiding unhealthy operation of the power device. On the other hand, availability of the power device and the power electronic application is extended to the physical limit of the power device.

In the above, embodiments pertaining to power semiconductor devices/modules and corresponding processing methods were explained.

For example, these semiconductor devices are based on silicon (Si). Accordingly, a monocrystalline semiconductor region or layer, e.g., the semiconductor body 10 and its regions/zones, e.g., regions etc. can be a monocrystalline Si-region or Si-layer. In other embodiments, polycrystalline or amorphous silicon may be employed.

It should, however, be understood that the semiconductor body 10 and its regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixC1-x) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:
1. A single chip power semiconductor device, comprising:
a first load terminal;
a second load terminal;
a semiconductor body integrated in the single chip and coupled to the first load terminal and the second load terminal and configured to conduct a load current along a load current path between the first and second load terminals;
a control terminal and at least one control electrode electrically connected to the control terminal, the at least one control electrode being electrically insulated from the semiconductor body and configured to control the load current based on a control voltage between the control terminal and the first load terminal;
a protection structure integrated, separately from the load current path, in the single chip and comprising a series connection of a plurality of pn-junctions with a plurality of first semiconductor regions of a first conductivity type and a plurality of second semiconductor regions of a second conductivity type, the series connection of the pn-junctions being connected in forward bias between the control terminal and the first load terminal, wherein the pn-junctions are formed by the plurality of the first semiconductor regions and the plurality of the second semiconductor regions, wherein each pn-junction has a built-in voltage with a negative temperature coefficient.

2. The single chip power semiconductor device of claim 1, wherein each of the plurality of the first semiconductor regions and the plurality of the second semiconductor regions is based on at least one of polycrystalline silicon and polycrystalline germanium.

3. The single chip power semiconductor device of claim 1, wherein the protection structure is thermally coupled to the load current path.

4. The single chip power semiconductor device of claim 1, wherein a thermal resistance and a thermal capacitance between the protection structure and the load current path in the semiconductor body define a thermal time constant of no greater than 1 µs.

5. The single chip power semiconductor device of claim 1, wherein the total forward voltage of the series connection of the pn-junctions decreases with increasing temperature of the series connection of the pn-junctions.

6. The single chip power semiconductor device of claim 1, wherein the protection structure is configured to limit, by discharging the at least one control electrode, the control voltage between the control terminal and the first load terminal to a value corresponding to a sum of the temperature dependent built-in voltages of the pn-junctions.

7. The single chip power semiconductor device of claim 1, further comprising a lower insulation layer that isolates the series connection of the plurality of pn-junctions with the plurality of the first semiconductor regions and the plurality of the second semiconductor regions from the semiconductor body.

8. The single chip power semiconductor device of claim 1, further comprising:
an active cell region with one or more power cells integrated in the semiconductor body and configured for conduction of the load current; and
an edge termination region surrounding the active cell region and terminated by a chip edge,
wherein the first load terminal comprises a source pad structure laterally overlapping with the active region,
wherein the control terminal comprises a control pad structure,
wherein both the source pad structure and the control pad structure are arranged above a frontside of the semiconductor body,
wherein at least an upper insulation layer of the single chip separates, along a vertical direction, both the source pad structure and the control pad structure from the frontside of the semiconductor body.

9. The single chip power semiconductor device of claim 8, wherein the series connection of the plurality of pn-junctions with the plurality of the first semiconductor regions and the plurality of the second semiconductor regions is arranged at least partially below the upper insulation layer.

10. The single chip power semiconductor device of claim 9, further comprising at least one of:
a first protection structure contact plug extending from the source pad structure through the upper insulation layer and establishing an electrical connection between the source pad structure and at least one of the first semiconductor regions; and a second protection structure contact plug extending from the control pad structure through the upper insulation layer and establishing an electrical connection between the control pad structure and at least one of the second semiconductor regions.

11. The single chip power semiconductor device of claim 10, wherein both the first and the second protection structure contact plugs extend for at least 1 µm along the vertical direction.

12. The single chip power semiconductor device of claim 8, wherein the control pad structure comprises at least one of a control runner and a control finger separated from the source pad structure by a gap region, and wherein the series connection of the plurality of pn-junctions with the plurality of the first semiconductor regions and the plurality of the second semiconductor regions extends into a region corresponding to a vertical projection of the gap region.

13. The single chip power semiconductor device of claim 12, wherein at least one of the control runner and the control finger extends between two adjacent source pads of the source pad structure.

14. The single chip power semiconductor device of claim 12, further comprising a well region of the second conductivity type and electrically connected with the first load terminal, and wherein the well region extends below the protection structure and into the region corresponding to the vertical projection of the gap region.

15. The single chip power semiconductor device of claim 12, wherein the region corresponding to the vertical projection of the gap region is at least partially located in a central portion laterally closer to a center of the active region as compared to the chip edge.

16. The single chip power semiconductor device of claim 1, wherein at least a portion of the pn-junctions is located closer to the load current path as compared to an electrical connection connecting the series connection of the pn-junctions to the control terminal.

17. The single chip power semiconductor device of claim 1, wherein the protection structure comprises a plurality of short circuit elements short circuiting np-junctions formed by pairs of a respective first semiconductor region and an adjacent second semiconductor region.

18. A power semiconductor module comprising a plurality of integrated single chip power semiconductor devices of claim 1.

19. A single chip power semiconductor device, comprising:
a first load terminal;
a second load terminal;
a semiconductor body integrated in the single chip and coupled to the first load terminal and the second load terminal and configured to conduct a load current along a load current path between the first and second load terminals;
a control terminal and at least one control electrode electrically connected to the control terminal, the at least one control electrode being electrically insulated from the semiconductor body and configured to control the load current based on a control voltage between the control terminal and the first load terminal;
a protection structure integrated, separately from the load current path, in the single chip and comprising a series connection of a plurality of pn-junctions with a plurality of first semiconductor regions of a first conductivity type and a plurality of second semiconductor regions of a second conductivity type, the series connection of the pn-junctions being connected in forward bias between the control terminal and the first load terminal;

an active cell region with one or more power cells integrated in the semiconductor body and configured for conduction of the load current; and an edge termination region surrounding the active cell region and terminated by a chip edge, wherein the first load terminal comprises a source pad structure laterally overlapping with the active region, wherein the control terminal comprises a control pad structure, wherein both the source pad structure and the control pad structure are arranged above a frontside of the semiconductor body, wherein at least an upper insulation layer of the single chip separates, along a vertical direction, both the source pad structure and the control pad structure from the frontside of the semiconductor body.

20. The single chip power semiconductor device of claim 19, wherein the series connection of the plurality of pn-junctions with the plurality of the first semiconductor regions and the plurality of the second semiconductor regions is arranged at least partially below the upper insulation layer.

21. The single chip power semiconductor device of claim 20, further comprising at least one of:

a first protection structure contact plug extending from the source pad structure through the upper insulation layer and establishing an electrical connection between the source pad structure and at least one of the first semiconductor regions; and a second protection structure contact plug extending from the control pad structure through the upper insulation layer and establishing an electrical connection between the control pad structure and at least one of the second semiconductor regions.

22. The single chip power semiconductor device of claim 21, wherein both the first and the second protection structure contact plugs extend for at least 1 µm along the vertical direction.

23. The single chip power semiconductor device of claim 19, wherein the control pad structure comprises at least one of a control runner and a control finger separated from the source pad structure by a gap region, and wherein the series connection of the plurality of pn-junctions with the plurality of the first semiconductor regions and the plurality of the second semiconductor regions extends into a region corresponding to a vertical projection of the gap region.

24. The single chip power semiconductor device of claim 23, wherein at least one of the control runner and the control finger extends between two adjacent source pads of the source pad structure.

25. The single chip power semiconductor device of claim 23, further comprising a well region of the second conductivity type and electrically connected with the first load terminal, and wherein the well region extends below the protection structure and into the region corresponding to the vertical projection of the gap region.

26. The single chip power semiconductor device of claim 23, wherein the region corresponding to the vertical projection of the gap region is at least partially located in a central portion laterally closer to a center of the active region as compared to the chip edge.

27. A single chip power semiconductor device, comprising:

a first load terminal;

a second load terminal;

a semiconductor body integrated in the single chip and coupled to the first load terminal and the second load terminal and configured to conduct a load current along a load current path between the first and second load terminals;

a control terminal and at least one control electrode electrically connected to the control terminal, the at least one control electrode being electrically insulated from the semiconductor body and configured to control the load current based on a control voltage between the control terminal and the first load terminal;

a protection structure integrated, separately from the load current path, in the single chip and comprising a series connection of a plurality of pn-junctions with a plurality of first semiconductor regions of a first conductivity type and a plurality of second semiconductor regions of a second conductivity type, the series connection of the pn-junctions being connected in forward bias between the control terminal and the first load terminal, wherein the protection structure comprises a plurality of short circuit elements short circuiting np-junctions formed by pairs of a respective first semiconductor region and an adjacent second semiconductor region.

* * * * *